(12) United States Patent
Singh et al.

(10) Patent No.: US 11,901,304 B2
(45) Date of Patent: Feb. 13, 2024

(54) INTEGRATED CIRCUIT STRUCTURE WITH FLUORESCENT MATERIAL, AND RELATED METHODS

(71) Applicant: GLOBALFOUNDRIES U.S. Inc., Malta, NY (US)

(72) Inventors: Sunil K. Singh, Mechanicville, NY (US); Vibhor Jain, Clifton Park, NY (US); Siva P. Adusumilli, South Burlington, VT (US); Sebastian T. Ventrone, South Burlington, VT (US); Johnatan A. Kantarovsky, South Burlington, VT (US); Yves T. Ngu, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 190 days.

(21) Appl. No.: 17/323,423

(22) Filed: May 18, 2021

(65) Prior Publication Data
US 2022/0375871 A1 Nov. 24, 2022

(51) Int. Cl.
*H01L 23/544* (2006.01)
*H01L 23/48* (2006.01)
*H01L 23/00* (2006.01)

(52) U.S. Cl.
CPC ......... *H01L 23/544* (2013.01); *H01L 23/481* (2013.01); *H01L 23/57* (2013.01); *H01L 23/573* (2013.01); *H01L 2223/5442* (2013.01); *H01L 2223/54433* (2013.01)

(58) Field of Classification Search
CPC ..... H01L 23/544; H01L 23/57; H01L 23/573; H01L 2223/544; H01L 2223/54406; H01L 2223/54413; H01L 2223/5442; H01L 2223/54433; H01L 2223/54473; H01L 2223/5448; H01L 22/00; H01L 22/30
See application file for complete search history.

(56) References Cited

U.S. PATENT DOCUMENTS

| | | | |
|---|---|---|---|
| 5,897,924 A | 4/1999 | Ulczynski et al. |
| 9,685,958 B2 | 6/2017 | Bhunia et al. |
| 10,095,889 B2 | 10/2018 | Pedersen et al. |
| 10,263,793 B2 | 4/2019 | Rezayee et al. |
| 10,623,192 B2 | 4/2020 | Wang |

(Continued)

FOREIGN PATENT DOCUMENTS

EP 2778263 A2 9/2014

OTHER PUBLICATIONS

Abdollahi et al., "Photoswitchable fluorescent polymer nanoparticles as high-security anticounterfeiting materials for authentication and optical patterning," J. Mater. Chem. C, 2020, 8, 5476.

(Continued)

*Primary Examiner* — Robert G Bachner
*Assistant Examiner* — Molly K Reida
(74) *Attorney, Agent, or Firm* — Anthony Canale; Hoffman Warnick LLC

(57) ABSTRACT

The disclosure provides an integrated circuit (IC) structure with fluorescent materials, and related methods. An IC structure according to the disclosure may include a layer of fluorescent material on an IC component. The layer of fluorescent material defines a portion of an identification marker for the IC structure.

19 Claims, 13 Drawing Sheets

(56) References Cited

U.S. PATENT DOCUMENTS

| | | |
|---|---|---|
| 10,657,291 B2 | 5/2020 | Pedersen et al. |
| 2005/0031785 A1 | 2/2005 | Carlisle et al. |
| 2006/0097394 A1* | 5/2006 | Filippi .................... H01L 22/24 |
| | | 257/E21.583 |
| 2010/0207283 A1* | 8/2010 | Wu ....................... H01L 23/544 |
| | | 257/E23.179 |
| 2011/0259951 A1* | 10/2011 | Meyerson ............. H01L 23/544 |
| | | 235/494 |
| 2020/0343042 A1* | 10/2020 | Pinarbasi .............. H01L 27/222 |

OTHER PUBLICATIONS

Kalytchuk et al., "Carbon Dot Fluorescence-Lifetime-Encoded Anti-Counterfeiting," ACS Appl. Mater. Interfaces 2018, 10, 29902-29908.

Liu et al., "Achieving Multicolor Long-Lived Luminescence in Dye-Encapsulated Metal-Organic Frameworks and Its Application to Anticounterfeiting Stamps," ACS Appl. Mater. Interfaces 2018, 10, 1802-1809.

Leech et al., "Reactive ion etching of diamond in $CF_4$, $O_2$, $O_2$ and Ar-based mixtures," Journal of Materials Science 36 (2001) 3453-3459.

* cited by examiner

INTEGRATED CIRCUIT STRUCTURE WITH FLUORESCENT MATERIAL, AND RELATED METHODS

TECHNICAL FIELD

Embodiments of the disclosure relate generally to integrated circuits (ICs). More specifically, embodiments of the disclosure provide a structure and related methods to verify such a structure.

BACKGROUND

In the microelectronics industry, the ability for certain actors to modify chips is of increasing concern. The effects of unauthorized modification may range from innocuous effects (e.g., incoherent data on a display) to critical failures (e.g., erratic pacemaker clocking). In some cases, these effects may be difficult to discern from random errors and/or degradation from age. As partnerships between manufacturers across the globe becomes increasingly important to manufacturing effectiveness, control over sensitive events and/or transfers in the supply chain have become increasingly important to manufacturers and customers.

SUMMARY

Aspects of the disclosure provide an integrated circuit (IC) structure, including: a layer of fluorescent material on an IC component, wherein the layer of fluorescent material defines a portion of an identification marker for the IC structure.

Further aspects of the disclosure provide a method of verifying an integrated circuit (IC) structure, the method including: detecting a layer of fluorescent material on an IC component, wherein the detected layer of fluorescent material defines a portion of an identification marker for the IC structure; and comparing the identification marker with a verification map for the IC structure to verify the IC structure.

Additional aspects of the disclosure provide an integrated circuit (IC) structure, including: an IC component on a substrate; and a layer of fluorescent material on the IC component, wherein the layer of fluorescent material defines a portion of an identification marker for the IC structure.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
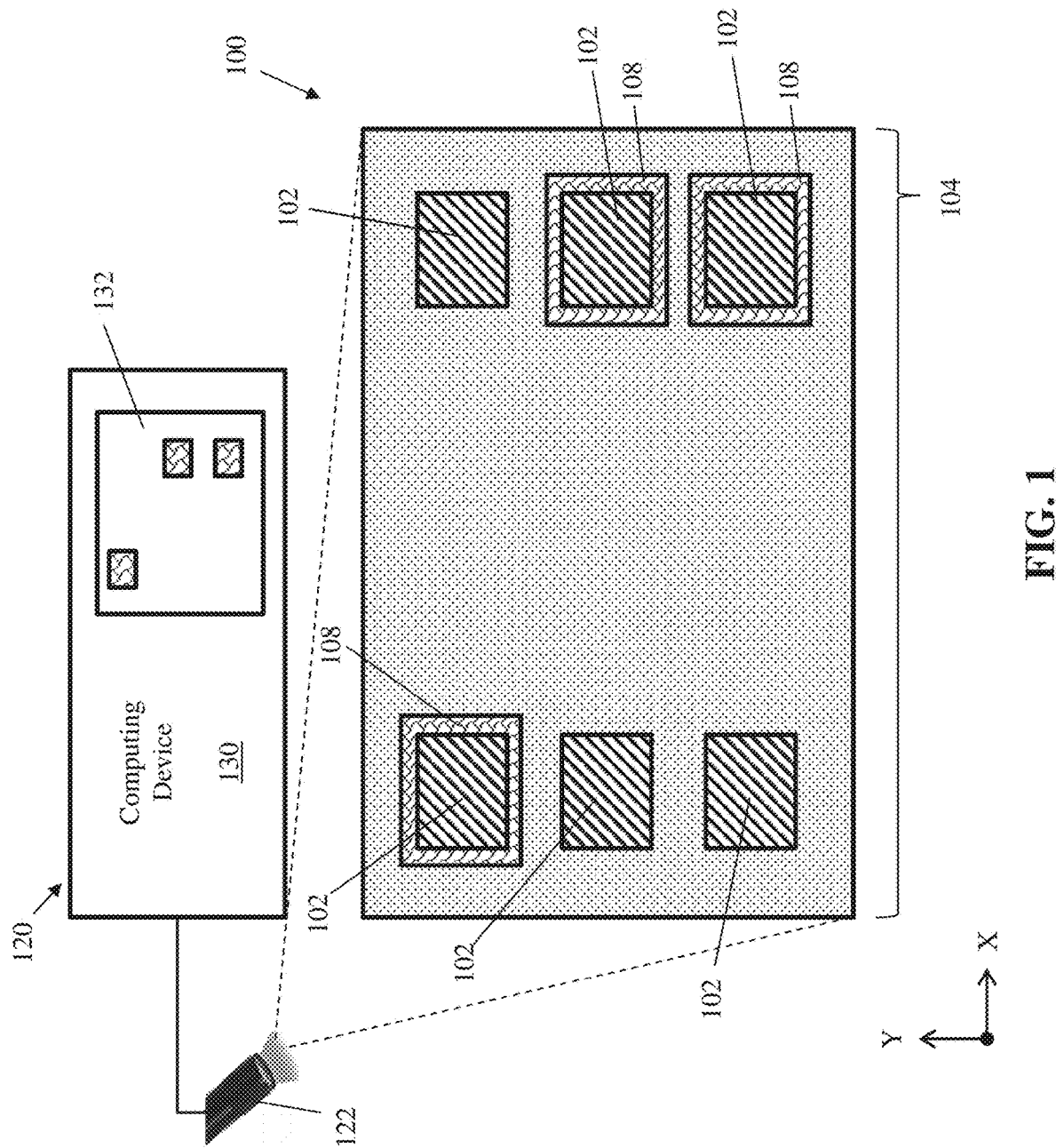
FIG. 1 depicts a plan view of an IC structure with fluorescent material, and tools to verify the IC structure, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide structures and methods to verify integrated circuit (IC) structures, e.g., to determine whether a product is subject to unauthorized modification. Embodiments of the disclosure may provide an IC structure in which a layer of fluorescent material is on an IC component. The fluorescent material may be formed as a single region or as part of a pattern of such regions. The layer of fluorescent material defines part of an identification marker for the IC structure. Using tools for irradiating the fluorescent material, an analyst may compare the location of fluorescent materials with a map for the IC structure to verify the authenticity of a product. The fluorescent material may be formed as a film of material in contact with various surfaces of a metal layer, via, substrate, and/or any other conceivable component, within an IC structure. Moreover, the component(s) coated with fluorescent material may or may not be included in electrically active regions of the IC structure.

Verifying the IC structure may be implemented using a verification map of the IC structure, indicating the location(s) of the fluorescent material and/or other identifying characteristics of the IC structure. The verification map may be provided solely to a recipient of the IC structure, e.g., via secure communication channel(s). The recipient may examine the IC structure to see whether the fluorescent material location(s) match corresponding locations within the verification map. In some cases, each distinct unit of the IC structure may have a unique verification map.

Referring to FIG. 1, embodiments of the disclosure may include and/or may be implemented on an integrated circuit (IC) structure 100. The methods described herein, moreover, may be implemented on IC structure 100 to verify whether the structure or portions thereof were subject to unauthorized modification. IC structure 100 shown in FIG. 1 may represent part of larger structure extending across a two-dimensional area in plane X-Y. IC structure 100 may include several IC components 102 distributed across an area 104 (e.g., insulative and/or other materials separating IC components 102 from each other). Area 104 may include only part of IC structure 100, or an entirety of IC structure 100 in various applications. IC components 102 may include any conceivable active or inactive component with IC structure 100, e.g., for serving various operational and/or manufacturing purposes.

According to an example, IC component(s) 102 in IC structure 100 may include electrically active conductors such as wires, vias, etc., for transmitting a current through IC structure 100. In further non-limiting examples, IC component(s) 102 may include, e.g., active or inactive semiconductor materials, conductors, insulators, transistors, capacitors, inductors, liners, guard rings, etc. IC component(s) 102 in further examples may include component sub-assemblies such logic gates, inverters, amplifiers, clocks, power sources, photonic assemblies, etc. In the FIG. 1 example, IC component(s) 102 are illustrated as vias (extending into or out of the X-Y plane), separated by portions of insulator material distributed across area 104. Although some portions of IC component(s) 102 may be interconnected, they may include distinct structure(s) and/or materials usable with various fluorescent materials as described herein.

Embodiments of IC structure 100 may include a fluorescent material 108 on a portion of IC component(s) 102. In the FIG. 1 example, several layers of fluorescent material 108 are adjacent sidewalls of respective IC components 102 within area 104. Other IC components 102, however, lack fluorescent material 108 thereon and thus may be differentiated from IC components 102 that have fluorescent material 108 within area 104. Fluorescent material 108 may include any currently known or later developed material that exhibits fluorescence when subjected to light radiation (e.g., in wavelengths that are within the visible spectrum and/or otherwise detectable through radiation sensitive equipment). Fluorescence refers to the emission of radiation by a substance during its exposure to a source of radiation, e.g., light, X-rays, etc. In an example, fluorescent material 108 may include a diamond. In a more specific example, fluorescent material 108 may include a synthetic diamond deposited via chemical vapor deposition (CVD). In the case of a CVD deposited synthetic diamond, fluorescent material 108 may be manufactured to exhibit a particular kind of fluorescence (e.g., wavelengths with particular colors) when deposited on IC component(s) 102. Thus, fluorescent material 108 may be invisible to users and/or certain tools unless particular radiation wavelengths are applied. Fluorescent material(s) 108 may be formed on a variety of IC components 102 including, as non-limiting examples: metal layers including the last metal layer, liners on TSVs and/or vias (regardless of whether such components are electrically functional), a layer in an inter-level dielectric region, in a dicing channel, in a pattern on a backside surface or other surface of a semiconductor substrate, etc.

Various systems such as an analysis assembly 120 may be capable of verifying IC structure(s) 100 through analysis of fluorescent material 108. Analysis assembly 120 may include a radiation source 122, i.e., one or more lamps, diodes, and/or any currently known or later developed instrument capable of producing radiation (e.g., light) within the UV spectrum band or other desired wavelength. Radiation source 122 may transmit radiation to area 104 of IC structure 100. Various portions of IC structure 100 may absorb and/or reflect the radiation from radiation source 122. Fluorescent material 108 may exhibit fluorescence upon receiving radiation within certain frequency ranges. In this case, an observer such as a person, testing tool (e.g., photodetector), etc., may observe particular colors and/or types of fluorescence within area 104 of IC structure 100. Specifically, fluorescence will be detected at IC component(s) 102 with fluorescent material 108, while no fluorescence will be detected near IC component(s) 102 without fluorescent material 108.

The fluorescence of fluorescent material 108 at certain IC component(s) 102 may indicate whether IC structure 100 is subject to unauthorized modification. In some cases, analysis assembly 120 may include a computing device 130 for implementing methods according to the disclosure. Computing device 130 may be electrically coupled to radiation source 122 (e.g., through an electrical and/or data coupling as shown in FIG. 1), or alternatively may be independent of radiation source 122. Computing device 130, where applicable, may include computing architecture such as a processor unit, an input/output (I/O) interface, a memory, a bus, etc., for coupling to radiation source 122 and/or implementing various functions. Computing device 130, in some cases, may be in the form of a control circuit. Computing device 130 may include hardware and/or software for receiving data relative to the location of fluorescent material 108 on IC structure 100 (transmitted, e.g., from a user or another component coupled to computing device 130). With such data, computing device 130 may compare the observed fluorescence and/or locations with a verification map 132 for IC structure 100.

Verification map 132 may provide a model or other representation of area 104 to cross-reference various locations with the designated site(s) of fluorescent material(s) 108. Thus, verification map 132 verifies that IC structure 100 based on whether fluorescent material(s) 108 appear in portions of area 104 where they are designated on verification map 132, and do not appear in other locations. In further implementations, verification map 132 can specify certain types of IC component(s) 102 where fluorescent material(s) 108 will appear or not appear. In further implementations, verification map 132 may not be provided on computing device 130, and instead may be recorded for reference via any conceivable form of media (e.g., non-electronically stored documents).

Embodiments of the disclosure allow fluorescent material(s) 108 to be formed in a variety of locations (e.g., different types of IC components 102) on IC structure 100. Regardless of any structural and/or processing variations needed to provide fluorescent material(s) 108 at different locations and/or on different types of IC components 102, fluorescent material(s) 108 may function substantially as described herein with respect to FIG. 1.

Figure 2:
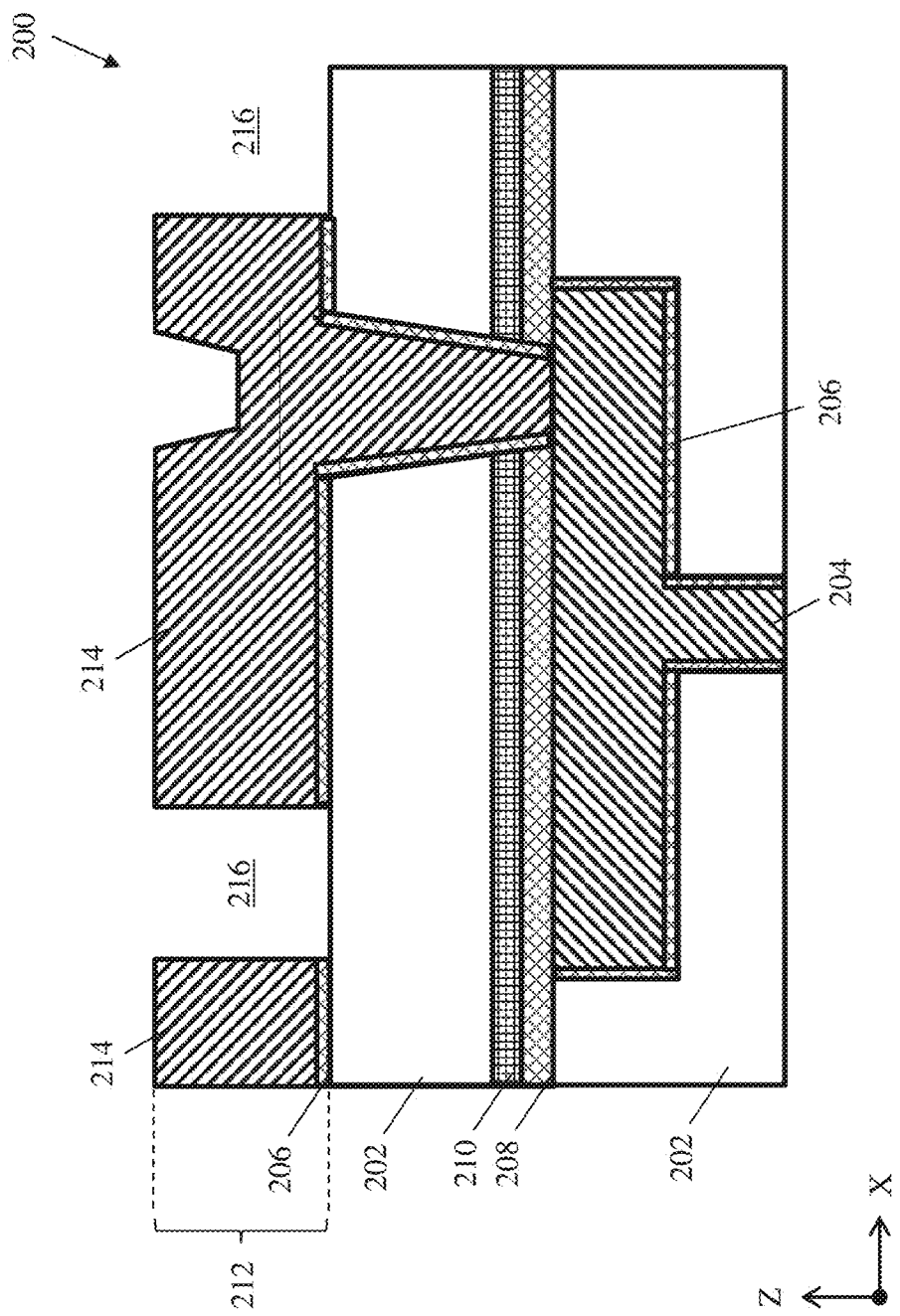
FIG. 2 depicts a cross-sectional view of a portion of an IC structure where fluorescent materials may be formed, according to embodiments of the disclosure.

FIG. 2 depicts an initial structure 200 before being processed into an embodiment of IC structure 100. The processing of structure 200 is discussed to illustrate how fluorescent material(s) 108 may be incorporated into a product. FIG. 2 shows a cross-sectional view of structure 200 with an insulator 202 in which one or more metal wires 204 may be formed. Insulator 202 may be formed of any currently-known or later developed substance for providing electrical insulation, and as examples may include: silicon nitride ($Si_3N_4$), silicon oxide ($SiO_2$), fluorinated $SiO_2$ (FSG), boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. In some cases, e.g., where structure 200 is on another layer of conductive and/or dielectric material, insulator 202 may be an inter-level dielectric (ILD) layer for separating different conductive layers of a structure.

Structure 200 may include one or more metal wires 204 for interconnecting various elements through insulator 202 of one metal level, and/or from one metal level, to another. Metal wire(s) 204 may include one or more conductive materials formed by deposition and/or etching, and may include a combination of vertically extending and horizontally extending sections via formation by, e.g., dual damascene. Metal wire(s) 204 may include one or more conductive metals, metal alloys, etc., and thus may include copper (Cu), aluminum (Al), gold (Au), etc. Metal wire(s) 204 additionally may be formed on, e.g., refractory metal liners 206 to protect from electromigration degradation and/or to separate conductive materials of metal wire(s) 204 from insulator 202 or other adjacent materials. Refractory metal liners 206 may include materials such as but not limited to: tantalum nitride (TaN) and tantalum; tantalum nitride, tantalum and cobalt, or combinations thereof.

Structure 200 may include additional layers of insulating material to further isolate distinct metal levels from each other. For example, structure 200 may include an insulator film 208 in the form of, e.g., doped silicon carbide and/or other insulative materials with similar properties. Structure 200 can additionally or alternatively include at least one nitride region 210 (e.g., a middle of line (MOL) nitride) extending laterally through insulator 202. Nitride region 210 can have electrically insulating properties, similar to a remainder of insulator 202, yet can include a different chemical composition. More specifically, nitride region 210 can be composed of a material with a greater resistance to wet etching than a remainder of insulator 202, as discussed elsewhere herein. Where insulator 202 includes a nitride material, nitride region 210 can be composed of a different nitride material with a greater ability to resist structural modification (e.g., various forms of etching during fabrication) than insulator 202, such as a silicon nitride ($Si_3N_4$).

Structure 200 as shown in FIG. 2 is at a phase in which a subsequent metal level 212 is only partially formed. Subsequent metal level 212, in some cases, may be the final metal level to be formed amongst, for example, ten or more distinct metal levels. Embodiments of the disclosure allow fluorescent material(s) 108 (FIG. 1) to be embedded in subsequent metal level 212 while it is still being formed. Subsequent metal level 212 may be considered to be one type of IC component 102 (FIG. 1), on which fluorescent material 108 may be formed. FIG. 2 depicts a conductor layer 214 deposited within an opening of insulator 202, and on portions of an upper surface of insulator 202. Conductor layer 214 may include aluminum in the case of a last metal layer, or may include other conductors described herein in the case of other metal layers and/or technical applications (e.g., copper, gold, etc.). Refractory metal liner 206 is beneath and/or alongside portions of conductor layer 214 to protect from degradation and for separation from insulator 202, as discussed herein. One or more openings 216 may be alongside portions of conductor layer 214, e.g., to be filled with various insulative and/or lining materials in subsequent fabrication. Embodiments of the disclosure thus may integrate the forming of fluorescent materials into the lining of conductor layer 214.

Figure 3:
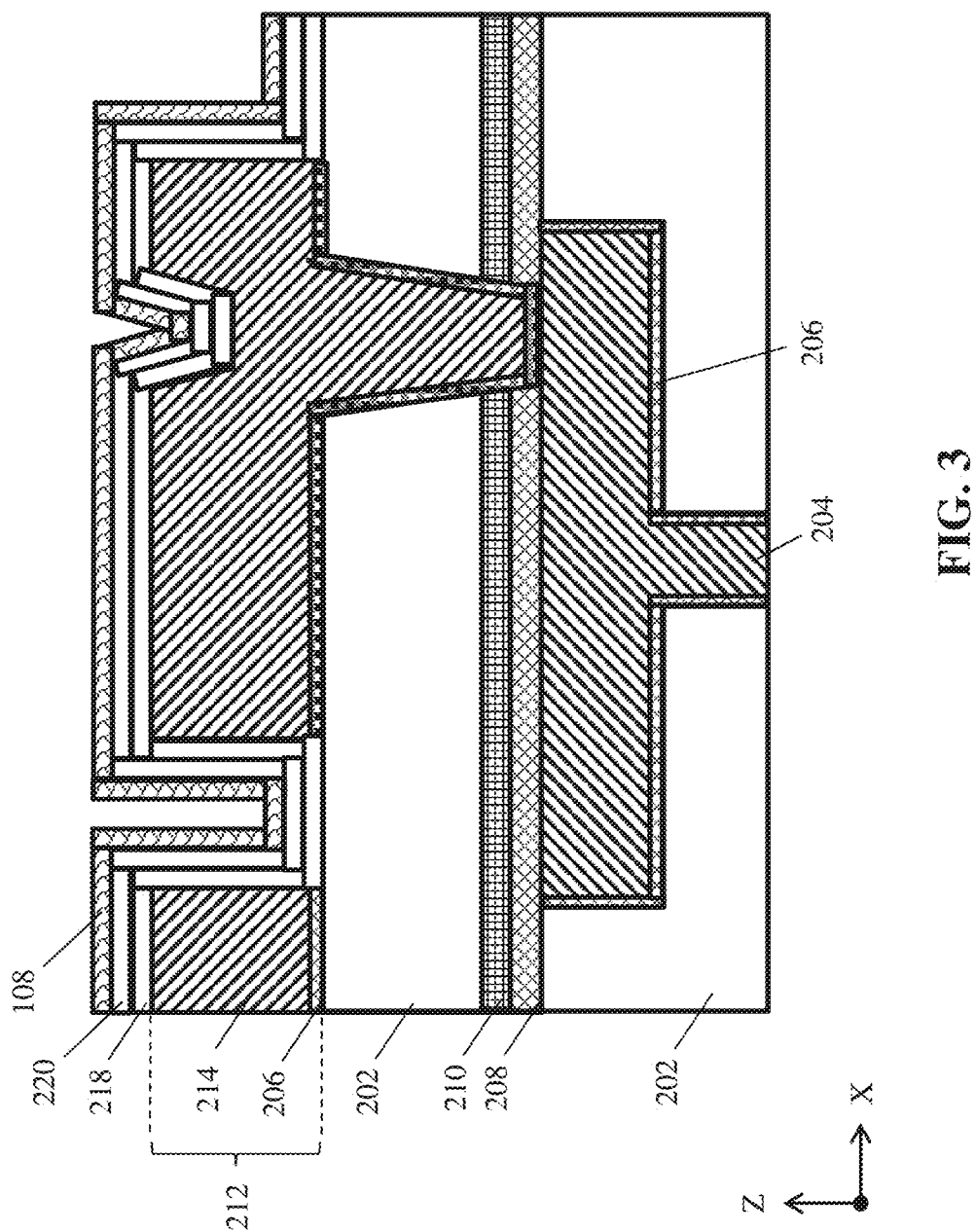
FIG. 3 depicts a cross-sectional view of forming fluorescent material on the IC structure, according to embodiments of the disclosure.

FIG. 3 depicts a process to line conductor layer 214 with fluorescent material(s) 108, in addition to other films of electrically insulative material. For instance, an insulator liner 218 may be formed on conductor layer 214 and within opening(s) 216 (FIG. 2), e.g., by deposition to a desired thickness. Insulator liner 218 may have the same composition and/or a similar dielectric constant as insulator 202, and/or other insulative materials described herein. Additionally or alternatively, embodiments of the disclosure may include forming a nitride liner 220 on insulator liner 218, or otherwise on conductor layer 214 and/or within opening 216. Nitride liner 220 may include any currently known or later developed nitride insulative materials, including those previously described with respect to nitride region 210. Regardless of whether liner(s) 218, 220 are used, further processing may include forming fluorescent material(s) 108 on subsequent metal layer 212 (e.g., over conductor layer 214) by chemical vapor deposition and/or other techniques suitable to form a layer of fluorescent material 108 on exposed surfaces. With fluorescent material 108 in place, further processing can continue substantially in accordance with known techniques to form metal levels of a product.

Figure 4:
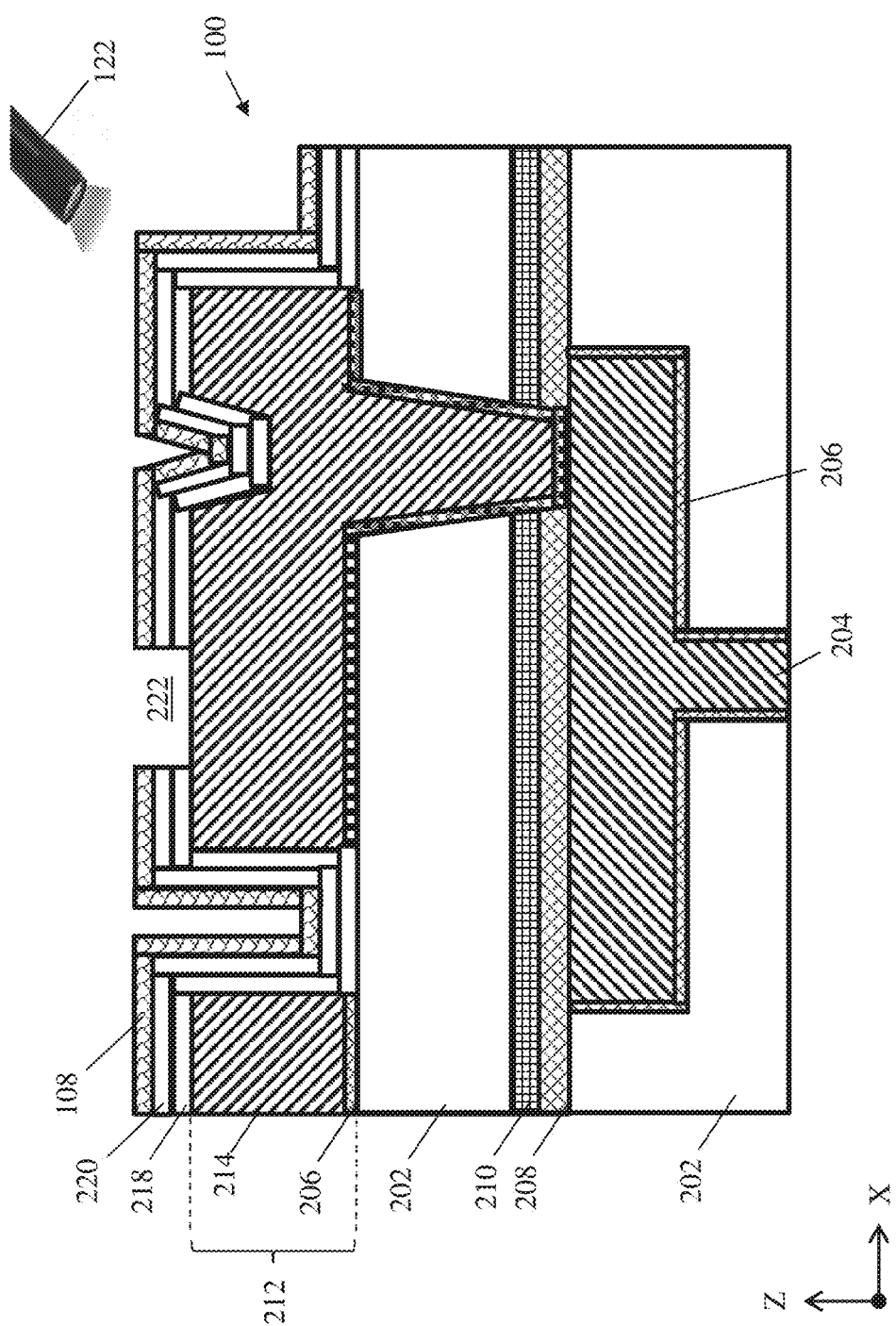
FIG. 4 depicts a cross-sectional view of further processing of the IC structure and irradiating to detect the fluorescent material, according to embodiments of the disclosure.

FIG. 4 depicts further processing to yield IC structure 100 according to embodiments of the disclosure. Here, some portions of insulator liner 218, nitride liner 220, and/or fluorescent material 108 may be removed from targeted locations over conductor layer 214 (e.g., by etching with the aid of a mask (not shown) to form an opening 222. Opening 222 may define the site of coupling from subsequent metal level 212 to an external coupling element, e.g., solder ball, intermediate conductor, additional metal level, etc. Forming of such components on and/or within opening 222 are generally known and thus not discussed in further detail. In any case, forming of fluorescent material(s) 108 in subsequent metal level 212 allows radiation source 122 to detect the presence of fluorescent material(s) 108 on subsequent metal level 212. Other components of subsequent metal level 212 may be transparent or otherwise non-fluorescent, and thus the presence of various other conductive and/or insulative components within subsequent metal level 212 does not affect the ability for radiation source 122 to transmit radiation to fluorescent material(s) 108. Other portions of subsequent metal level 212, and/or other metal levels of IC structure 100, may not include fluorescent material(s) 108. Thus, the inclusion or absence of fluorescent material(s) 108 in identifiable locations of IC structure 100 allow users to verify whether IC structure 100 is subject to unauthorized modification, through radiation source 122. That is, the mere presence of fluorescent material(s) 108 in IC structure 100 does not verify, in and of itself, whether a given product or unit is genuine. Rather, one or more products may be verified based on whether fluorescent material(s) 108 are in locations that correspond to verification map 132 (FIG. 1) or other representations of IC structure 100 to indicate whether a product is genuine.

Figure 5:
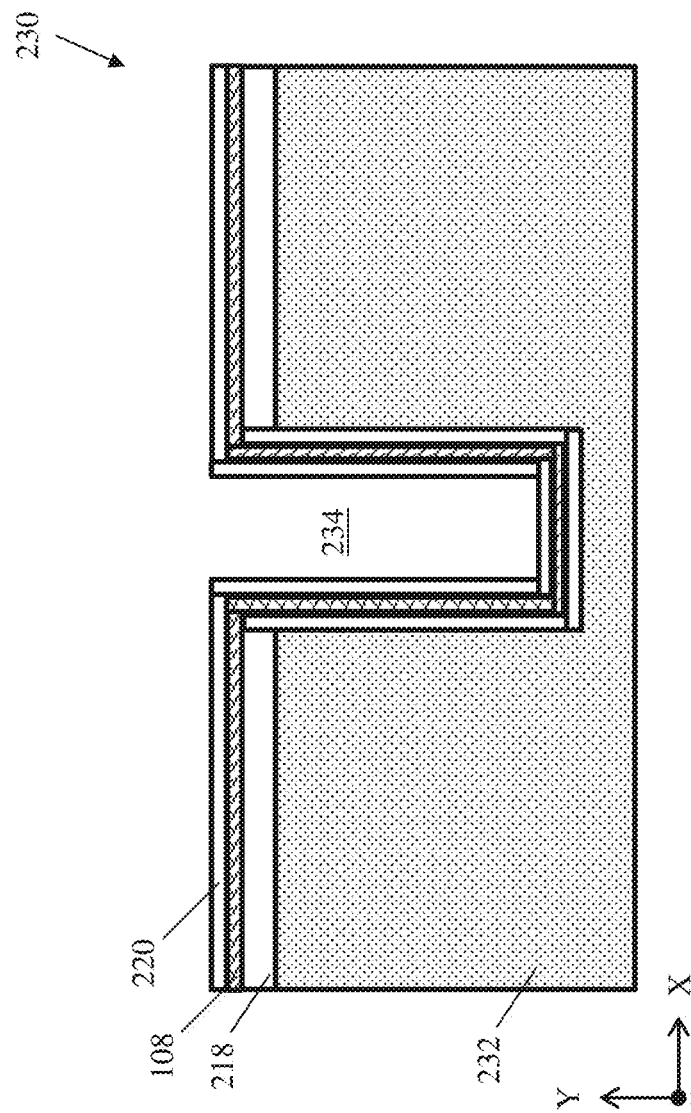
FIG. 5 depicts a cross-sectional view of forming a fluorescent material within a via opening, according to embodiments of the disclosure.

Referring now to FIG. 5, embodiments of the disclosure can allow fluorescent material 108 to be formed as an intermediate liner between other types of structures and/or locations. FIG. 5 depicts an initial structure 230 having a substrate 232, on and within which various other components may be formed. Substrate 232 may include, e.g., one or more semiconductor materials. Substrate 232 more specifically may include but is not limited to silicon, germanium, silicon germanium, silicon carbide, or any other common IC semiconductor substrates. The entirety of substrate 232 or a portion thereof may be strained. Substrate 232 may include, e.g., a via opening 234 extending at least partially into substrate 232. Via opening 234 may be formed by masking and etching of substrate 232, thus defining a location to form conductive materials that may extend vertically from one side of substrate 232 to another.

FIG. 5 depicts substrate 232 before conductive materials are formed therein. For example, an insulator liner 218 may be formed on substrate 232 and within via opening 234, and insulator liner 218 may include the same material(s) described with respect to other embodiments and/or similar insulator materials. Fluorescent material(s) 108 can be formed on insulator liner 218 (or, in some cases, directly on substrate 232 and/or within via opening 234) as an additional layer substantially as described in other implementations. Further processing may include forming nitride liner 220 (e.g., by deposition) on fluorescent material(s) 108 and within a portion of via opening 234, substantially as described in further implementations. Here, fluorescent material(s) 108 may be an intermediate liner between two other materials, e.g., insulator liner 218 and nitride liner 220, for conductive materials formed in opening 234.

Figure 6:
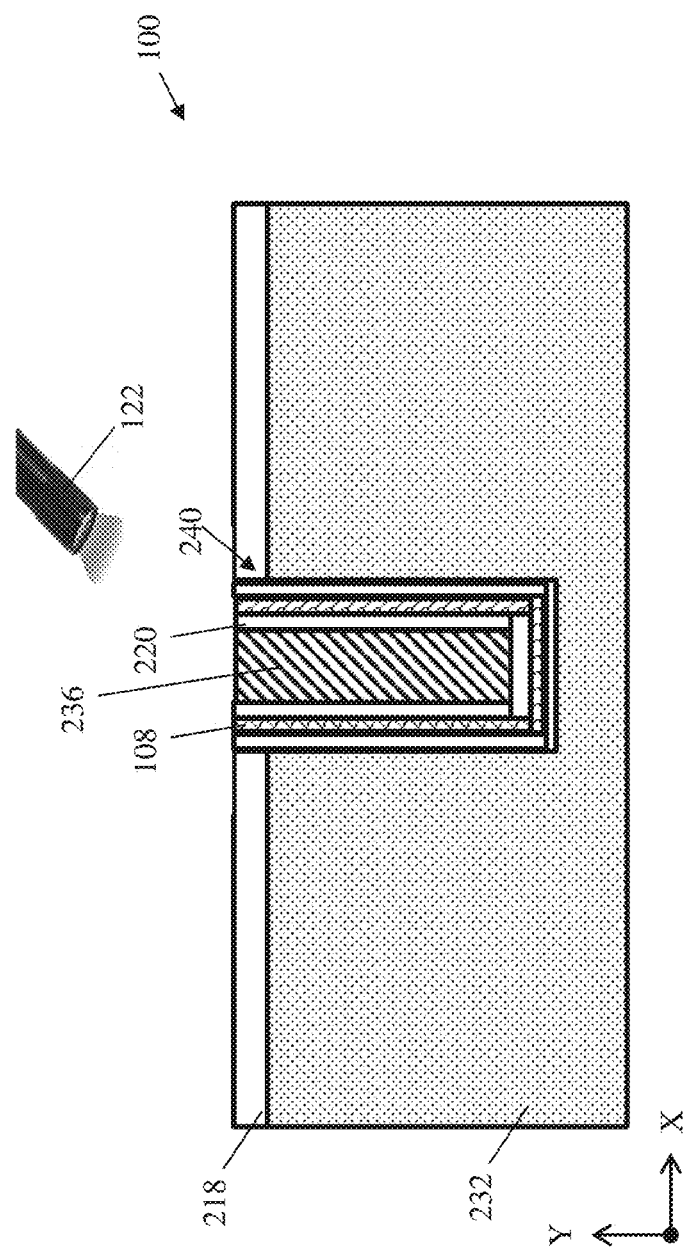
FIG. 6 depicts a cross-sectional view of filling the via opening with fluorescent material and via metal, and irradiating to detect the fluorescent material, according to embodiments of the disclosure.

Referring to FIG. 6, embodiments of the disclosure may include forming a via metal 236 in via opening 234 (FIG. 5). With fluorescent material(s) 108 in place, optionally together with (and/or between) liners 218, 220, via metal 236 may be formed in via opening 234 by deposition. Via metal 236 may include, for example, at least one of: copper, tungsten, tantalum, titanium, etc. Via metal 236 may have a height of, e.g., approximately ten micrometers (μm) to approximately 120 μm, or more particularly between approximately fifty μm and approximately sixty μm. Via metal 236 may have a cross-sectional width, or diameter, of approximately ten μm. However, it is to be understood that embodiments of the disclosure may be equally applicable to via metals 236 having heights greater than 120 μm and/or diameters less than ten μm (e.g., five μm or less).

Figure 7:
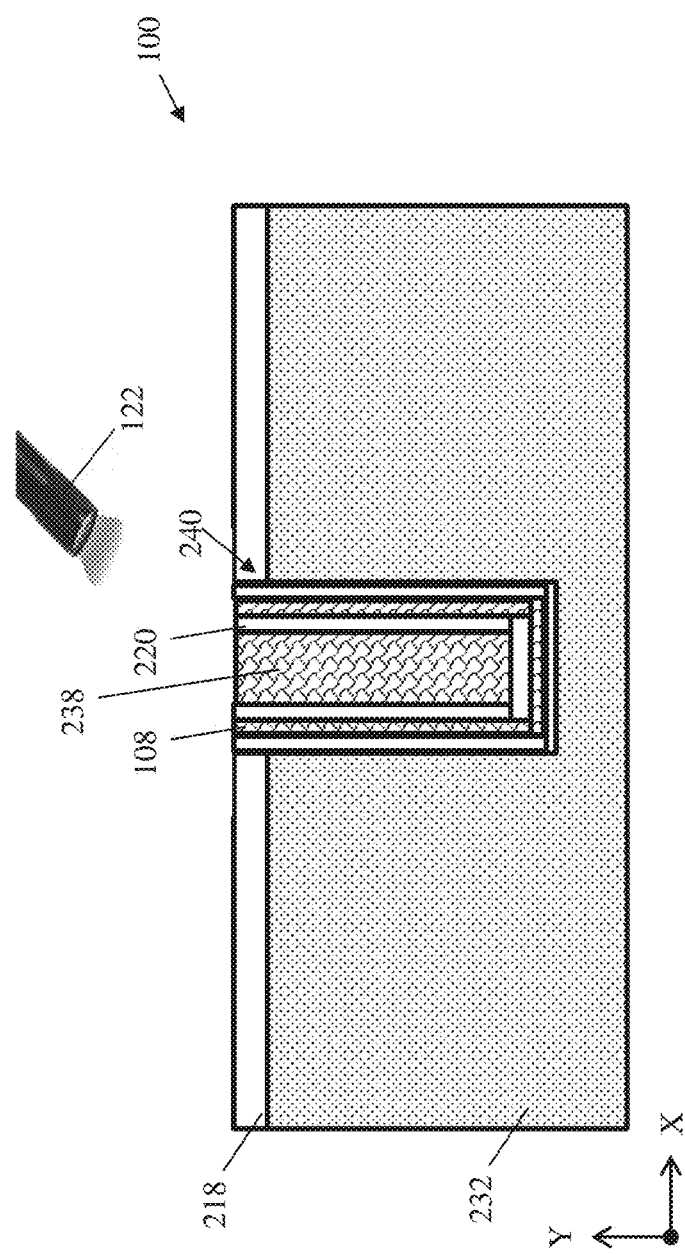
FIG. 7 depicts a cross-sectional view of filling the via opening with a non-metal via according to further embodiments of the disclosure.

Turning now to FIG. 7, further embodiments of the disclosure may include forming a non-metal via 238 in via opening 234 (FIG. 5). Non-metal via 238 may include, e.g., non-conductive materials such as borophosphosilicate glass (BPSG) and/or any other conceivable material capable of being formed within via opening 234, e.g., by deposition. In yet another example, non-metal via 238 may include the same fluorescent material(s) as may be used to form fluorescent material 108. In embodiments where non-metal via 238 is formed, and includes fluorescent materials therein, portions of liner(s) 218, 220 and/or other liner materials within via opening 234 may be omitted. Thus, non-metal via 238 may include any currently known or later developed non-conductive substance for providing an electrically inactive region, and/or itself may include fluorescent material(s) 108 capable of being detected with radiation source 122.

Referring to FIGS. 6 and 7, regardless of whether via metal 236 or non-metal via 238 is formed, further processing of IC structure 100 may include planarizing (e.g., using chemical mechanical planarization (CMP)) to an upper surface of insulator liner 218 (or alternatively, substrate 232 and/or other layers thereon) may be implemented. Planarizing of IC structure 100 may cause any via metals 236 and/or non-metal vias 238 to have a desired size within substrate 232. With via metal(s) 236 and/or non-metal via(s) 238 in place, IC structure 100 may include IC component 102 (FIG. 1) in the form of a through silicon via (TSV) 240 within substrate 232. Radiation source 122 can radiate TSV 240, and fluorescent material 108 on TSV(s) 240 and/or included within non-metal via(s) 238 will be detectable as radiation source 122 operates. Other portions of substrate 232, in addition, may be removed to join TSV 240 to other components within and/or external to IC structure 100.

Figure 8:
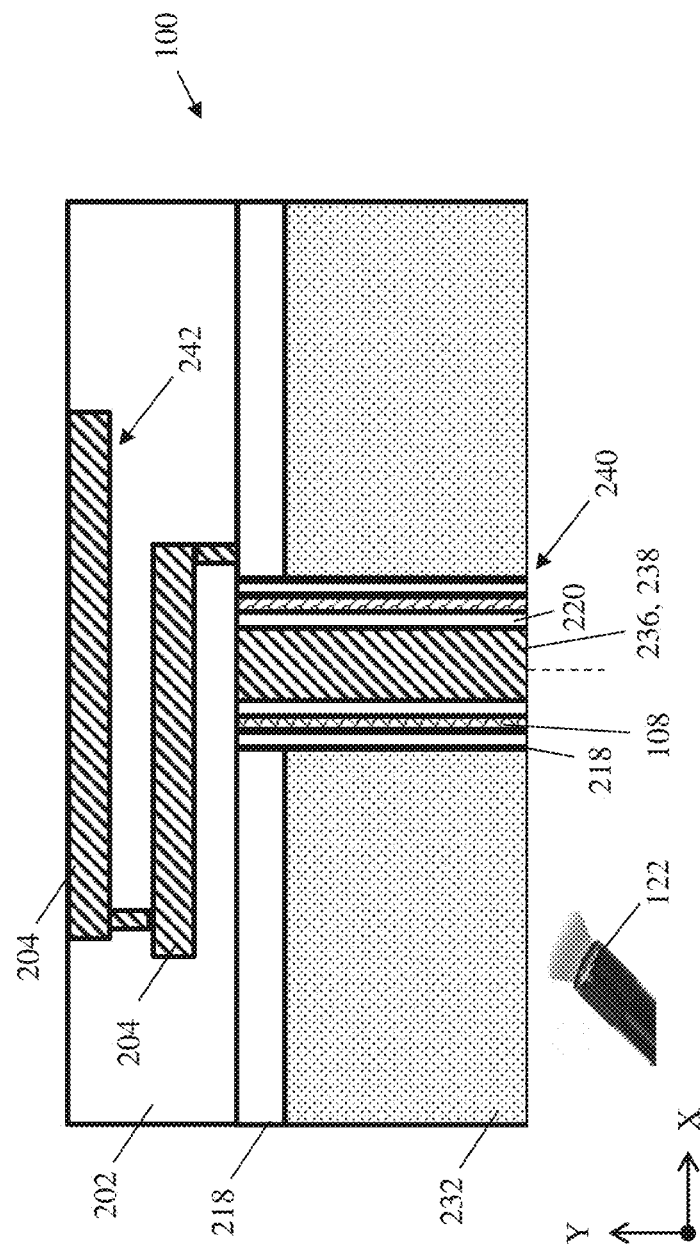
FIG. 8 depicts a cross-sectional view of an IC structure in which the via with fluorescent material is electrically disconnected from circuitry, according to embodiments of the disclosure.

FIG. 8 depicts a further implementation of IC structure 100, in which TSV 240 (possibly including via metal 236 and/or non-metal via 238) serves no electrical purpose but provides a site where fluorescent material 108 is located. In this case, insulator 202 (e.g., an ILD as discussed herein) may be formed on insulator liner 218, with various metal wires 204 being formed within insulator 202. Metal wires 204 may include refractory metal liners 206 (FIGS. 2-4) as described elsewhere herein, and such liners are omitted in FIG. 7 solely for clarify of illustration. It is possible, in alternative implementations, for one or more metal wires 204 to be formed to and/or in contact with TSV(s) 240. However, FIG. 8 depicts an example where a set of active circuitry 242 having metal wire(s) 204 therein is physically and electrically decoupled from TSV 240. In this case, TSV 240 serves no electrically operative function within IC structure 100. Nonetheless, fluorescent material 108 may be formed on sidewalls of TSV 240. Here, radiation source 122 may be able to transmit radiation to TSV 240 to identify fluorescent material(s) 108 thereon. Thus, IC component(s) 102 with fluorescent material 108 may not include operational components of IC structure 100, e.g., in the case of TSV(s) 240 that are disconnected from circuitry 242.

Figure 9:
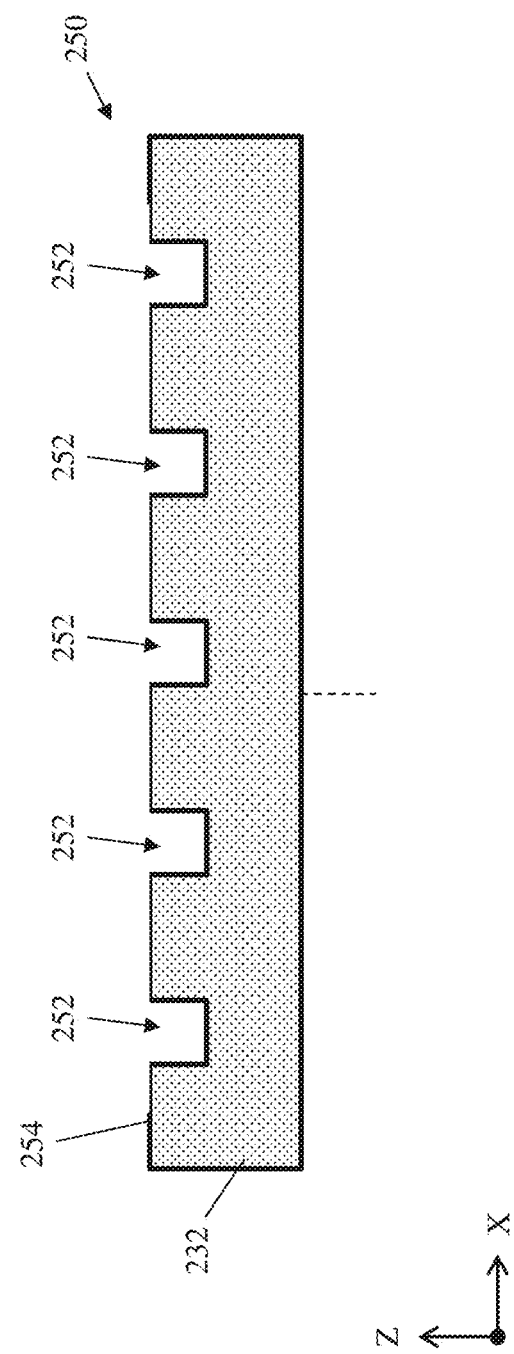
FIG. 9 depicts a cross-sectional view of a semiconductor substrate with trenches to be filled with fluorescent material, according to embodiments of the disclosure.
Figure 10:
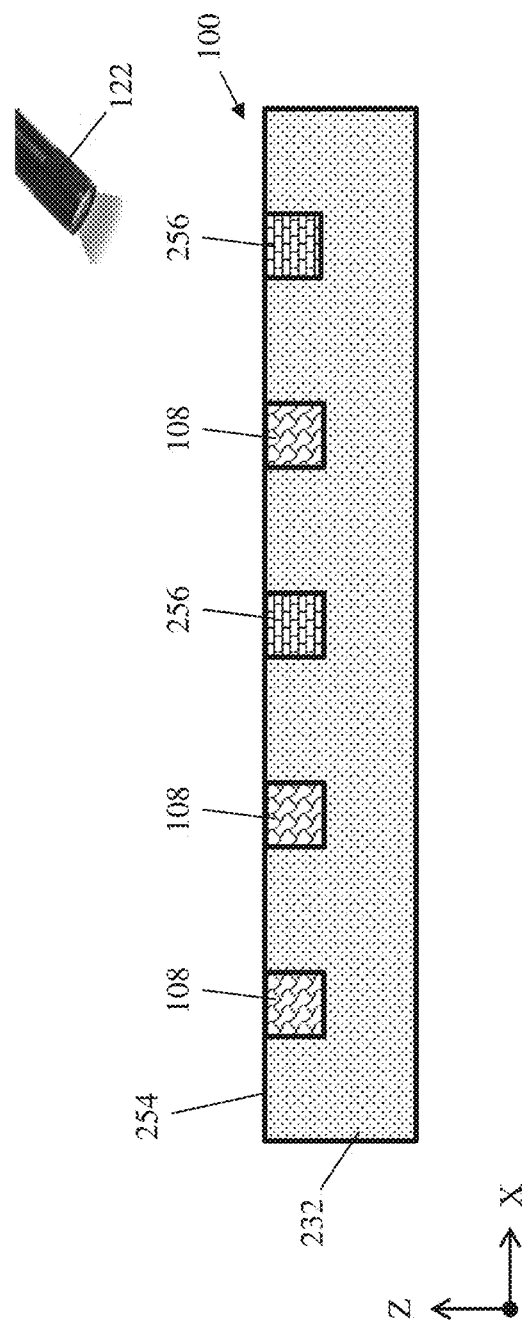
FIG. 10 depicts a cross-sectional view of filling the trenches with fluorescent material and irradiating the fluorescent material, according to embodiments of the disclosure.

Turning now to FIGS. 9 and 10, embodiments of the disclosure may be implemented such that substrate 232 itself is an IC component(s) 102 (FIG. 1) with fluorescent material 108 thereon. For example, an initial structure 250 (FIG. 8 only) may include one or more trenches 252 (FIG. 8 only) formed in substrate 232 directly. Trench(es) 252 may extend partially into substrate 232, and may not expose any materials other than the composition of substrate 232 itself. Trenches 252 in particular may be formed within a particular surface or area of substrate 232 that is free of electrically operative components.

In one example, trenches 252 may be within a backside surface 254 of substrate 232. Backside surface 254 may be vertically opposite a surface of substrate 232 where devices and/or other overlying components may be formed. Backside surface 254 conventionally does not include active structures or devices, and thus fluorescent material 108 may be formed within backside surface 254 of substrate 232 without interfering with operative elements. Trenches 252 may be formed within backside surface 254 after other processing concludes, e.g., after backside surface 254 is polished to a reduced thickness. In another example, trenches 252 may be formed in a dicing region of IC structure 100.

However embodied, trench(es) 252 optionally may be free of additional materials, e.g., various insulative and/or conductive materials discussed herein. One or more of trench(es) 252 can then be filled with fluorescent material(s) 108, e.g., using CVD and other processes suitable to form fluorescent material(s) 108. In some cases, only some of trench(es) 252 may be filled with fluorescent material(s) 108, while other trench(es) 252 may be filled with non-fluorescent material(s) 256 (FIG. 9 only) (e.g., any conceivable material that lacks fluorescence as defined herein, e.g., conventional insulators and/or conductors). Radiation source 122 may be used with substrate 232 to identify the location(s) of fluorescent material(s) 108 as described elsewhere herein. The location(s) of fluorescent material(s) 108 and non-fluorescent material(s) 256 thus may define a marker for identifying IC structure 100. Such locations may be recorded, e.g., in verification map 132 (FIG. 1) as discussed herein.

Figure 11:
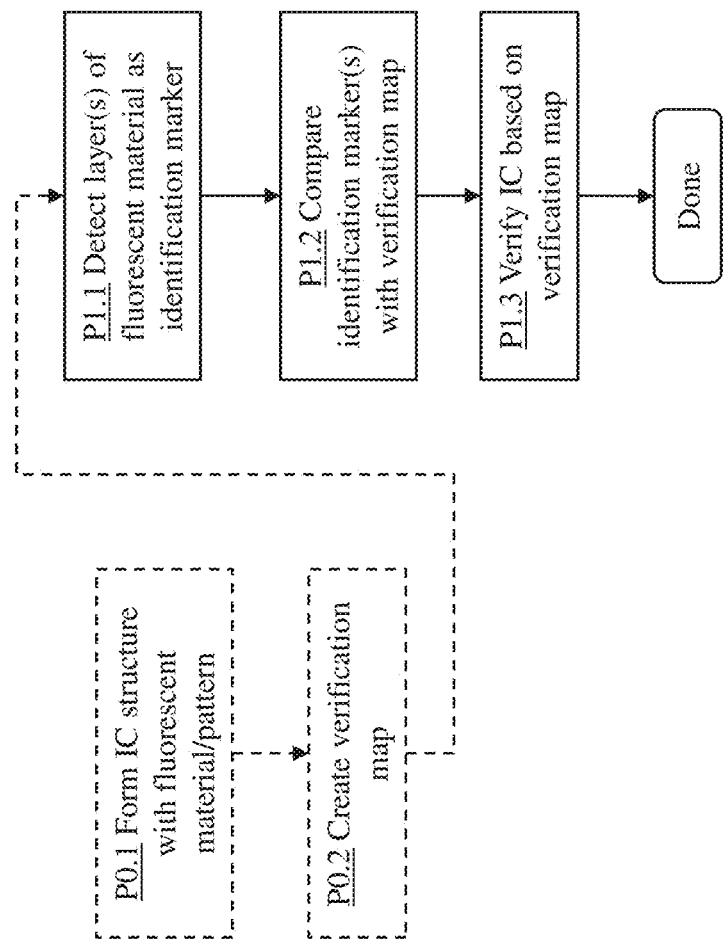
FIG. 11 depicts an illustrative flow diagram with methods to form, detect, and verify an IC structure with fluorescent materials, according to embodiments of the disclosure.
Figure 12:
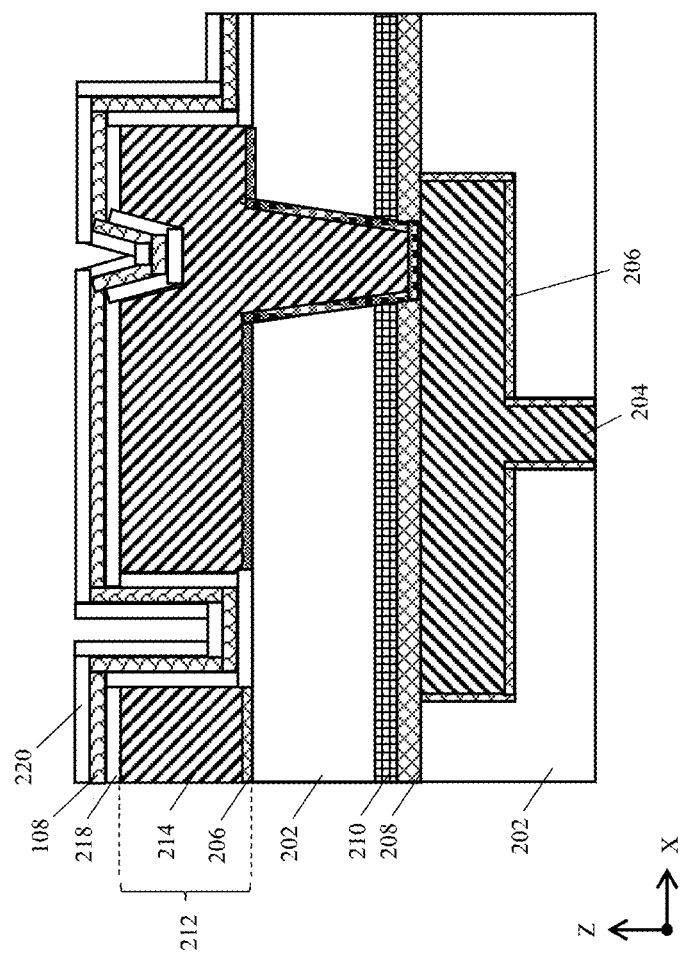
FIG. 12 depicts a cross-sectional view of a fluorescent material between an insulator liner and a nitride liner, according to embodiments of the disclosure.
Figure 13:
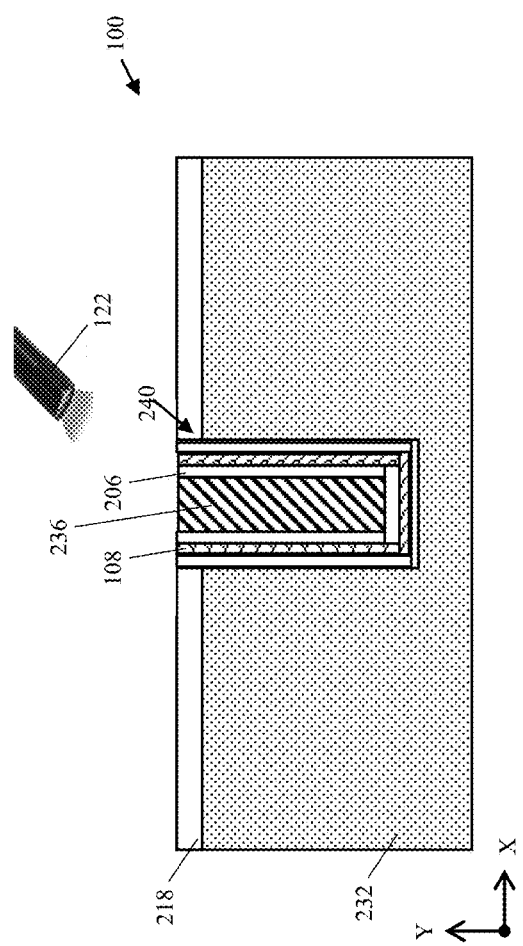
FIG. 13 depicts a cross-sectional view of a fluorescent material between an insulator liner and a refractory metal liner, according to embodiments of the disclosure.

FIG. 11 depicts an illustrative flow diagram with various operations to verify IC structure(s) 100 using fluorescent material(s) 108. Some operations described herein may be preliminary and/or implemented by other parties, and thus are shown in FIG. 10 with dashed lines. Referring to FIGS. 1 and 10 together, in process P0.1 includes, e.g., forming IC structure 100 with at least one region of fluorescent material 108. The forming of IC structure 100 can be implemented using any of the various examples discussed herein, and/or any other conceivable method to form fluorescent material 108 within IC structure 100. Methods according to the disclosure also may include, e.g., process P0.2 to create verification map 132 for specifying where fluorescent material 108 is expected to appear in IC structure 100. Verification map 132 may be provided to computing device 130 as data, and/or may be recorded in various other forms of storage media (including perhaps formats capable of being examined without computing device 130).

Further processes according to the disclosure may be implemented, e.g., by an eventual recipient of IC structure 100 after further manufacturing and/or transporting of IC structure 100 to its destination. Process P1.1 according to the disclosure may include, e.g., detecting fluorescent material(s) 108 on IC component(s) 102 using tools such as radiation source(s) 122 discussed herein. The detected fluorescent material(s) 108 in IC structure 100 may define an identification marker. Process P1.2 in embodiments of the disclosure may then include, e.g., comparing the identification marker(s) with fluorescent material(s) 108 therein with verification map(s) 132. The comparing in process P1.2 may be implemented, e.g., manually via an operator of radiation source(s) 122, and/or automatically via computing device(s) 130 coupled to radiation source(s) 122 and/or otherwise receiving inputs designating the identified location of fluorescent material(s) 108. Thereafter, process P1.3 includes verifying whether fluorescent material(s) 108 in IC structure 100 match the locations set forth in verification map 132. In the case where the location of fluorescent material(s) 108 matches verification map 132, IC structure 100 is verified. Otherwise, IC structure 100 may have been subject to unauthorized modification operations that removed fluorescent material(s) 108. The method may then conclude ("Done"), and IC structure 100 may be used or discarded based on the results of process P1.3.

Embodiments of the disclosure provide several technical and commercial advantages, some of which are discussed herein as examples. As is evident from the discussion herein, embodiments of the disclosure allow IC structure 100 to be manufactured with built-in verification features, thereby allowing IC structure 100 to be optically verified without specialized equipment. In some cases only radiation source(s) 122 are needed to verify whether IC structure 100 has experienced unauthorized modification. Embodiments of the disclosure also allow fluorescent material(s) 108 to be formed in a variety of preselected locations within IC structure 100, thus impeding the ability for third parties to reproduce and/or modify certain sensitive IC components 102. It may be possible for fluorescent material(s) 108 to appear or not appear in thousands or millions of locations, thus making it impossible for third parties to form fluorescent material(s) 108 in the same location(s) or later IC product 100 without altering fluorescent material 108 locations. For example, if a third party and/or intervening recipient receives IC structure 100 before it is provided to an eventual customer, altering IC structure 100 will affect portions of the structure that include fluorescent material 108. Such portions, if removed, will also cause fluorescent material 108 to be removed from IC structure 100. In such cases, remaining fluorescent material 108 IC structure(s) 100 will not match verification map 132 (FIG. 1).

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The structure and method as described above are used in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
    a layer of fluorescent material on an exterior surface of a via structure, wherein the layer of fluorescent material defines a portion of an identification marker for the IC structure,
    wherein the layer of fluorescent material is between the exterior surface of the via structure and an insulator liner.

2. The IC structure of claim 1, wherein the layer of fluorescent material includes a liner within a metal layer.

3. The IC structure of claim 1, wherein the layer of fluorescent material is on a refractory metal liner of the via structure.

4. The IC structure of claim 1, wherein the layer of fluorescent material includes a liner on a through silicon via (TSV), the TSV being disconnected from circuitry within the IC structure.

5. The IC structure of claim 1, wherein the layer of fluorescent material includes one of a plurality of layers of fluorescent material, the plurality of layers of fluorescent material defining the identification marker for the IC structure.

6. The IC structure of claim 1, wherein the layer of fluorescent material includes a chemical vapor deposited (CVD) diamond.

7. A method of verifying an integrated circuit (IC) structure, the method comprising:
    detecting a layer of fluorescent material on an IC component, wherein the detected layer of fluorescent material defines a portion of an identification marker for the IC structure;
    detecting the absence of fluorescent material on an adjacent IC component, wherein the detected layer of fluorescent material and the adjacent IC component define another portion of the identification marker for the IC structure; and
    comparing the identification marker with a verification map for the IC structure to verify the IC structure, wherein the verification map indicates at least one of the location of the fluorescent material and an identifying characteristic of the IC component, the verification map further including a representation of an area of the IC structure, wherein the verification map includes a subset of a plurality of IC components having the fluorescent material.

8. The method of claim 7, wherein detecting the layer of fluorescent material on the IC component includes irradiating a portion of a metal layer.

9. The method of claim 7, wherein detecting the layer of fluorescent material on the IC component includes irradiating a liner on a via.

10. The method of claim 9, wherein the irradiated liner is between a refractory metal liner of the via and an insulator liner of the via.

11. The method of claim 7, wherein detecting the layer of fluorescent material on the IC component includes irradiating a through silicon via (TSV), the TSV being disconnected from circuitry within the IC structure.

12. The method of claim 7, wherein detecting the layer of fluorescent material on the IC component includes irradiating a backside surface of a semiconductor substrate.

13. The method of claim 7, wherein detecting the layer of fluorescent material includes detecting a plurality of layers of fluorescent material, the plurality of layers of fluorescent material defining the identification marker for the IC structure.

14. The method of claim 7, wherein a computing device compares the identification marker with a verification map for the IC structure to verify the IC structure; and wherein distinct portions of the IC structure each have a unique verification map.

15. An integrated circuit (IC) structure, comprising:
- an IC component on a substrate, wherein the substrate includes a backside surface having a first trench and a second trench therein;
- a layer of fluorescent material within the first trench within the backside surface of the substrate, wherein the layer of fluorescent material defines a portion of an identification marker for the IC structure; and
- a non-fluorescent material within the second trench within the backside surface of the substrate.

16. The IC structure of claim 15, wherein the IC component includes a metal layer, and wherein the layer of fluorescent includes a liner on an inter-level dielectric (ILD) of the metal layer.

17. The IC structure of claim 15, wherein the IC component includes a via, and wherein the layer of fluorescent material includes an intermediate liner between a refractory metal liner of the via and an insulator liner of the via.

18. The IC structure of claim 15, wherein the layer of fluorescent material includes a chemical vapor deposited (CVD) diamond.

19. The method of claim 15, wherein the backside surface of the substrate is free of trenches between the first trench and the second trench.

* * * * *